United States Patent [19]
Contreras et al.

[11] Patent Number: 5,556,506
[45] Date of Patent: Sep. 17, 1996

[54] METHOD FOR FORMING A CONDUCTIVE LAYER OF MATERIAL ON AN INTEGRATED CIRCUIT SUBSTRATE

[75] Inventors: Michael A. Contreras, Austin; Robert E. Anderson, Cedar Park, both of Tex.

[73] Assignee: Motorola, Inc., Schaumburg, Ill.

[21] Appl. No.: 573,981

[22] Filed: Dec. 18, 1995

[51] Int. Cl.$^6$ ..................................................... C23C 14/00
[52] U.S. Cl. .................. 156/625.1; 204/192.23; 156/643.1; 118/723 R
[58] Field of Search ............................ 156/643.1, 625.1, 156/345 P; 118/723 FE, 723, 723 FI, 723 DC; 216/67, 71; 445/33, 35; 315/111.21, 111.31, 111.81; 313/231.31, 231.41, 231.61; 204/298.34

[56] References Cited

U.S. PATENT DOCUMENTS

| | | | |
|---|---|---|---|
| 4,968,374 | 11/1990 | Tsukada et al. | 156/345 |
| 5,449,432 | 9/1995 | Hanawa | 156/643.1 |
| 5,468,296 | 11/1995 | Patrick et al. | 118/723 MP |

Primary Examiner—R. Bruce Breneman
Assistant Examiner—Michael Adjodha
Attorney, Agent, or Firm—Kent J. Cooper

[57] ABSTRACT

In one embodiment a plasma ignitor (10) having a first dielectric housing (18), that encases a first portion of a first conductive lead (14) and a first portion of a second conductive lead (16), and end cap (30), that locks its filament (31) into position, is used to initiate a plasma within an etch chamber (64). The plasma is used to etch an integrated circuit substrate (62) and to form an etched surface (78). A conductive layer of material (80) is then deposited on the etched surface (78). The first dielectric housing (18) keeps the first portion of the first conductive lead (14) and the first portion of the second conductive lead (16) from shorting to one another during processing, and the end cap (30) prevents the filament (31) from falling off during processing. Thus, the present invention allows contact resistance to be repeatably minimized.

30 Claims, 5 Drawing Sheets

METHOD FOR FORMING A CONDUCTIVE LAYER OF MATERIAL ON AN INTEGRATED CIRCUIT SUBSTRATE

FIELD OF THE INVENTION

This invention relates generally to integrated circuits, and more specifically to a method for forming a conductive layer of material on an integrated circuit substrate.

BACKGROUND OF THE INVENTION

Advanced integrated circuits require multiple interconnect layers in order to successfully meet device density requirements. In addition, the overall resistance of these multiple interconnect layers must be low in order for advanced integrated circuits to meet their speed and reliability requirements. Contact resistance is a major source of resistance in multilevel interconnect schemes, and thus it must be minimized so that high speed integrated circuits can be reliably fabricated. High contact resistance is often the result of native oxide layers or other residues that lie along the interface between two adjoining interconnect layers. For example, the surface of a first interconnect layer, which is exposed through a via or contact opening often has a native oxide layer or other type of residue present on it. If the native oxide layer or residue is not removed prior to forming a second interconnect layer within the contact or via opening, then the contact resistance between the first and the second interconnect layers will be high. However, if the native oxide layer or residue is removed prior to forming the second interconnect layer, then the contact resistance between the first and second interconnect layers will be low. Various techniques have been proposed for removing these native oxide layers or residues in order to obtain low contact resistance. One proposed solution is to remove these interfacial layers with a sputter etching process prior to depositing the second interconnect layer. However, the sputter etching process is often unreliable because the ignitors, which are currently used to initiate the plasma for the sputter etching process, often fall apart or short out during processing. For example, in Varian sputter deposition systems the ignitor's two conductive leads, which are insulated with ceramic beads, often short to one another during processing. In addition, the ignitor's filament often falls off during processing. Accordingly, a need exists for a reliable plasma ignitor that can be used to reliably form multilevel interconnects with low contact resistance.

DETAILED DESCRIPTION OF A PREFERRED EMBODIMENT

Figure 1:
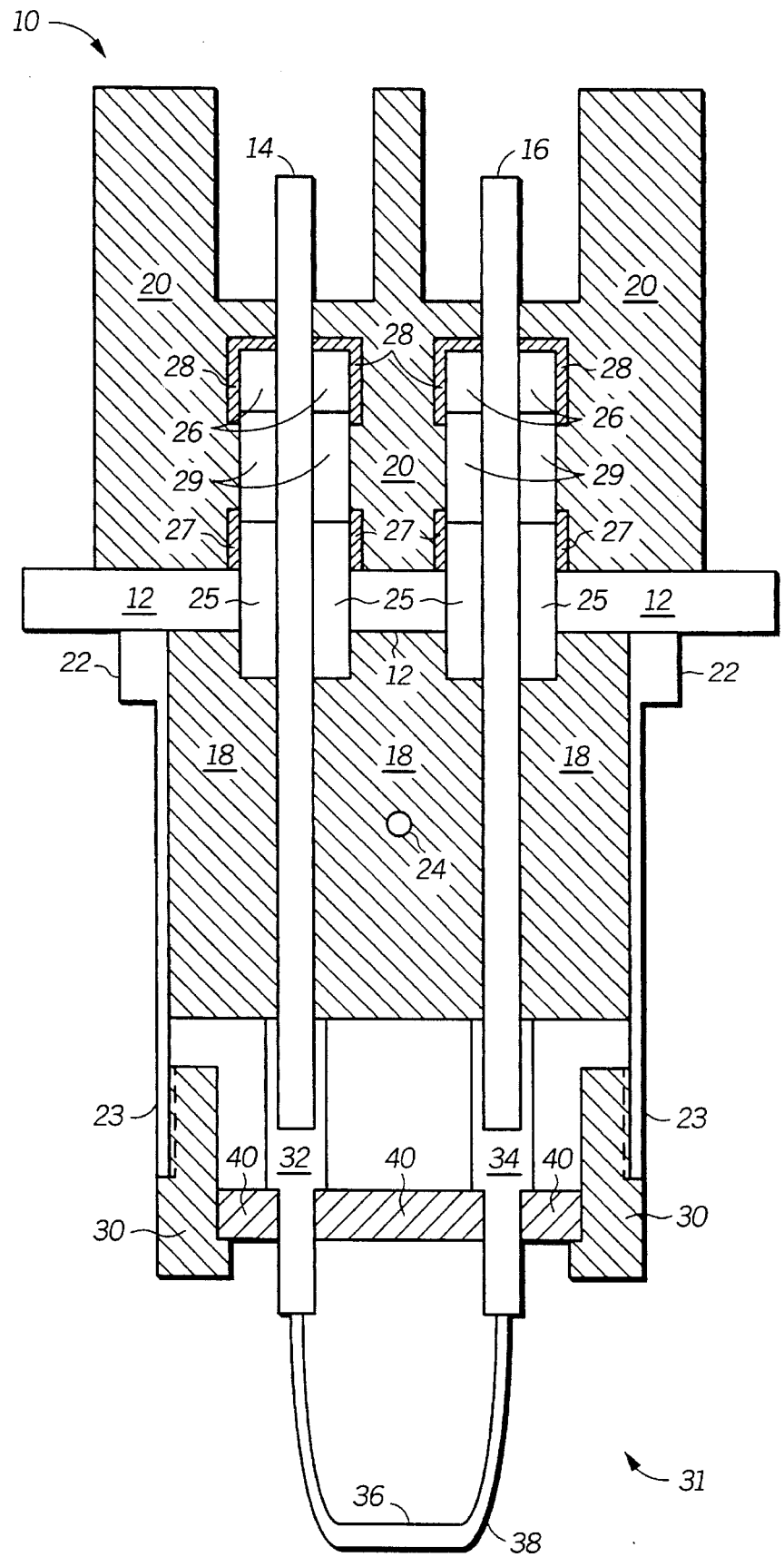
FIGS. 1–4 illustrate, in cross-section, a plasma ignitor in accordance with one embodiment of the invention.

FIGS. 1 through 4 illustrate a plasma ignitor 10 in accordance with one embodiment of the invention. Shown in FIG. 1, is a cross section of a plasma ignitor 10 comprising a vacuum flange 12, a first conductive lead 14, a second conductive lead 16, a first dielectric housing 18, a second dielectric housing 20, a sheath 22, a sheath pin 24, feedthrough insulators 25, 26 and 29, solder 27 and 28, an end cap 30, and a filament 31 having a first terminal 32, a second terminal 34, a first filament wire 36, a second filament wire 38, and a dielectric spacer 40.

In one embodiment, first conductive lead 14 and second conductive lead 16 are copper leads and vacuum flange 12 is a stainless steel conflat vacuum flange. Feedthrough insulators 25, 26, and 29, and solder 27 and 28 are used to electrically isolate first conductive lead 14 and second conductive lead 16 from vacuum flange 12, and to fix first conductive lead 14 and second conductive lead 16 into position so that movement of first conductive lead 14 and second conductive lead 16, in a direction perpendicular to vacuum flange 12, is restricted. A first set of feedthrough insulators 25 extend through vacuum flange 12 and electrically isolate first conductive lead 14 and second conductive lead 16 from vacuum flange 12. Feedthrough insulators 25 are held in place by solder 27. A second set of feedthrough insulators 26 are attached to first conductive lead 14 and second conductive lead 16 by solder 28. A third set of feedthrough insulators 29 lies between feedthrough insulators 25 and feedthrough insulators 26 so that solder 27 is electrically isolated from solder 28. Feedthrough insulators 29 abut feedthrough insulators 25 and a portion of solder 27 attaches feedthrough insulators 29 to feedthrough insulators 25. Feedthrough insulators 29 also abut feedthrough insulators 26 and a portion of solder 28 attaches feedthrough insulators 29 to feedthrough insulators 26. In one embodiment, feedthrough insulators 25, 26, and 29 are ceramic feedthrough insulators and solder 27 and 28 is formed with polyvinyl chloride solder using conventional soldering techniques.

A first portion of first conductive lead 14 and a first portion of second conductive lead 16 are encased in first dielectric housing 18. First dielectric housing 18 electrically isolates the first portion of first conductive lead 14 from the first portion of second conductive lead 16 and keeps first conductive lead 14 a fixed distance apart form second conductive lead 16. In one embodiment, first dielectric housing 18 is made of a material comprising polyimide, such as Vespel, Meldin 2021, Durotron HP, Celazole PB-1, or the like. Alternatively, first dielectric housing 18 may be made of another dielectric material such as ceramic.

Encircling first dielectric housing 18 is a sheath 22, which has an end portion 23 that extends beyond first dielectric housing 18. Sheath 22 is held in place by a sheath pin 24 that extends through a portion of sheath 22 and through a portion of first dielectric housing 18. In one embodiment, sheath 22 and sheath pin 24 are made of 304 stainless steel and end portion 23 of sheath 22 is threaded. Sheath 22 increases the structural integrity of plasma ignitor 10, by making it stronger and more rigid, and it also increases the durability and lifetime of plasma ignitor 10 because it protects dielectric housing 18 from the plasma, which is initiated by plasma ignitor 10.

End cap 30 fits onto end portion 23 of sheath 22 and is used to lock filament 31 into place. In one embodiment, end cap 30 is a dielectric end cap comprising polyimide, such as Vespel, Meldin 2021, Durotron HP, Celazole PB-1, or the like, which is threaded so that it screws into the threaded end portion of sheath 22. Alternatively, end cap 30 may be made of another material such as ceramic.

First terminal 32 of filament 31 slides over first conductive lead 14 and is electrically coupled to first conductive lead 14. Second terminal 34 of filament 31 slides over second conductive lead 16 and is electrically coupled to second conductive lead 16. In one embodiment, first terminal 32 and second terminal 34 are made of brass. Alternatively, first terminal 32 and second terminal 34 may be made of another conductive material, such as copper or nickel. The first end of filament wire 36 is attached and electrically coupled to first terminal 32 and the second end of filament wire 36 is attached and electrically coupled to second terminal 34. The first end of filament wire 38 is also attached and electrically coupled to first terminal 32 and the second end of filament wire 38 is also attached and electrically coupled to second terminal 34. In one embodiment, first filament wire 36 and second filament wire 38 are tungsten filament wires. Dielectric spacer 40 encases a portion of first terminal 32 and a portion of second terminal 34 and keeps first terminal 32 at a fixed distance apart from second terminal 34. In addition, dielectric spacer 40 is also used to lock filament 31 into place, as shown in FIG. 1. After filament 31 has been mounted onto first conductive lead 14 and second conductive lead 16, end cap 30 is mounted onto sheath 22 such that a first portion of end cap 30 abuts dielectric spacer 40 and a second portion of end cap 30 abuts sheath 22, thus locking filament 31 into position. In one embodiment, dielectric spacer 40 is made of a material comprising polyimide, such as Vespel, Meldin 2021, Durotron HP, Celazole PB-1, or the like. Alternatively, dielectric spacer 40 may be made using another dielectric material such as ceramic.

A second portion of first conductive lead 14 and a second portion of second conductive lead 16 are encased in second dielectric housing 20. Second dielectric housing 20 electrically isolates the second portion of first conductive lead 14 from the second portion of second conductive lead 16. In one embodiment second dielectric housing 20 is made of a material comprising polyimide, such as Vespel, Meldin 2021, Durotron HP, Celazole PB-1, or the like. Alternatively, second dielectric housing 20 may be made of another dielectric material such as ceramic.

Figure 2:
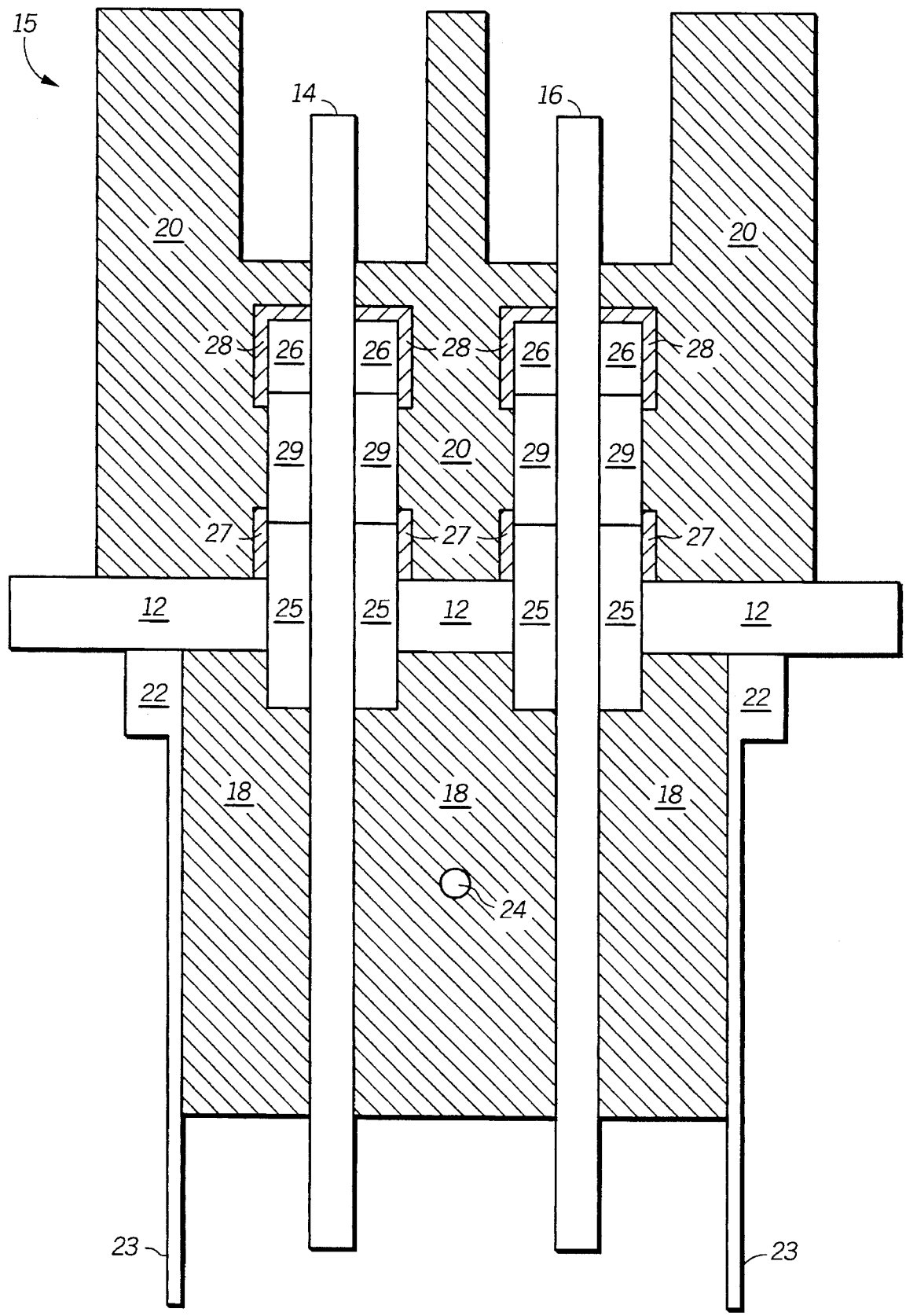

Shown in FIG. 2, is a cross sectional view of a portion 15 of plasma ignitor 10, wherein plasma ignitor 10 has been partially disassembled and end cap 30 and filament 31 have been removed.

Figure 3:
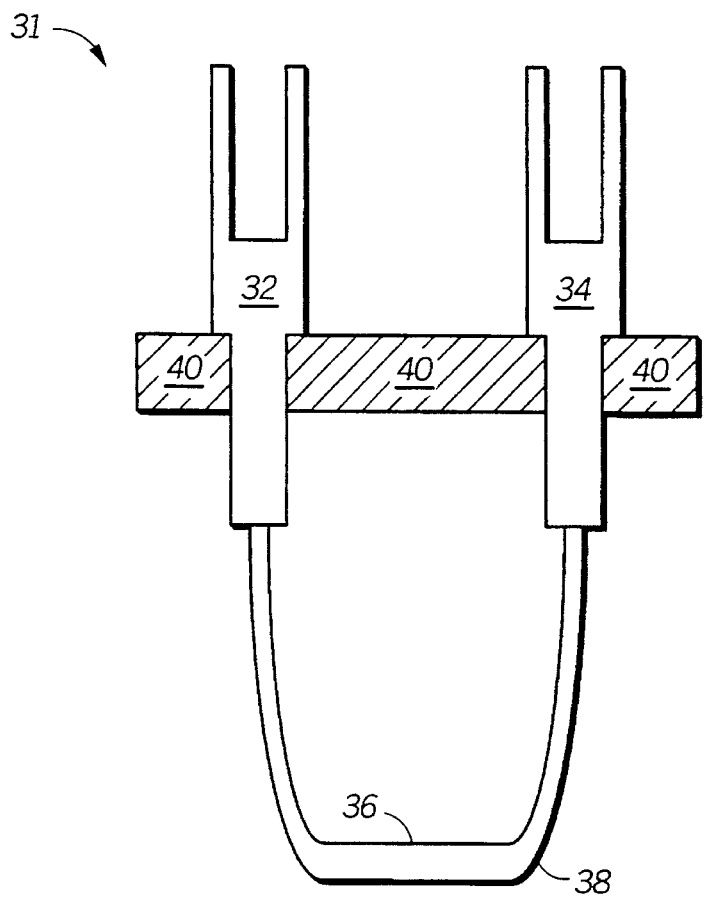

Shown in FIG. 3, is a cross-sectional view of filament 31, wherein filament 31 has been dismounted from first conductive lead 14 and second conductive lead 16.

Figure 4:
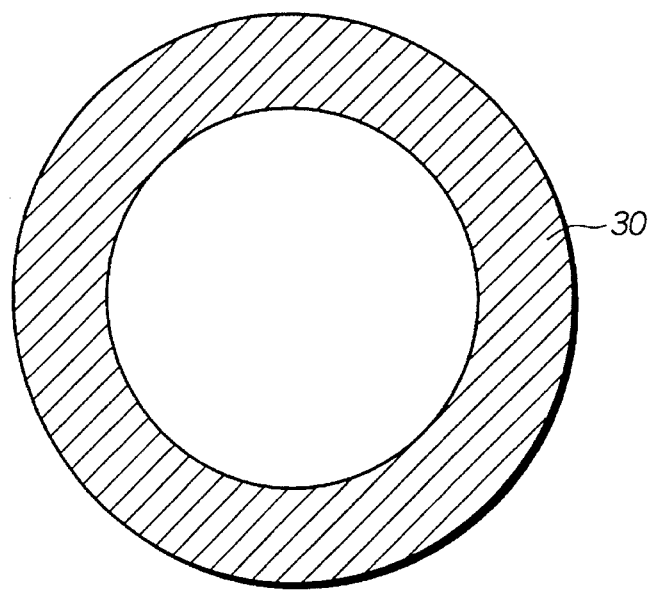

Shown in FIG. 4 is a top down view of end cap 30, wherein end cap 30 has been dismounted from sheath 22.

Figure 5:
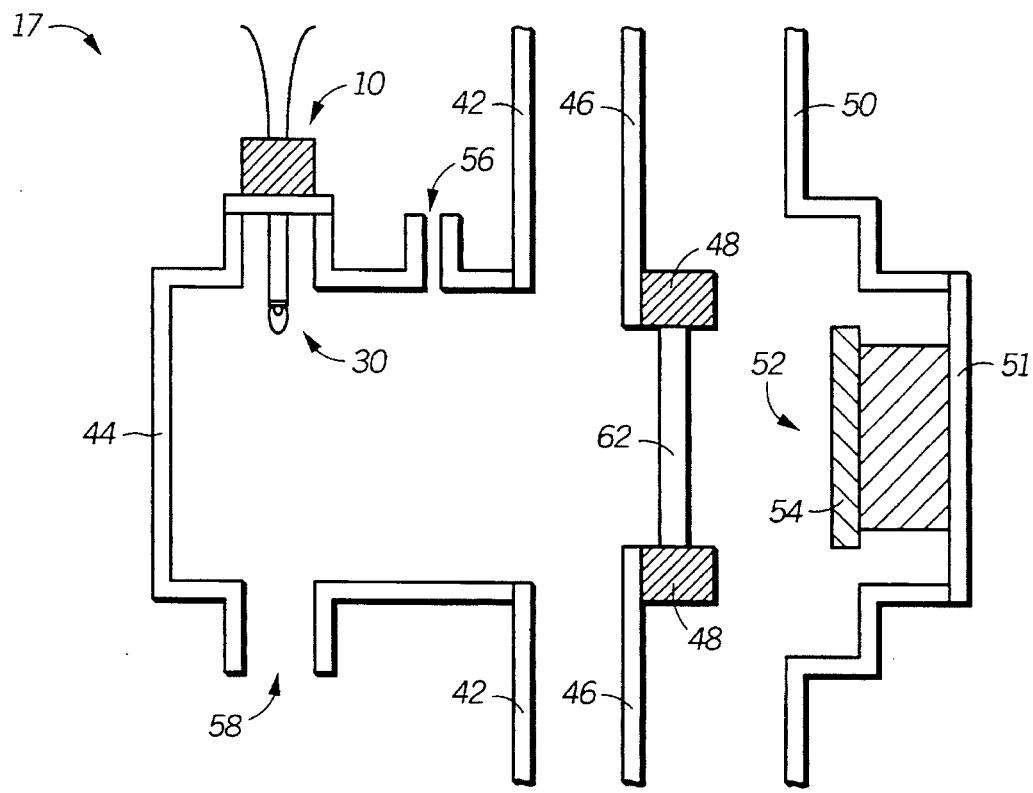
FIGS. 5–6 illustrate, in cross-section, a plasma ignitor and a deposition system in accordance with one embodiment of the invention.
Figure 6:
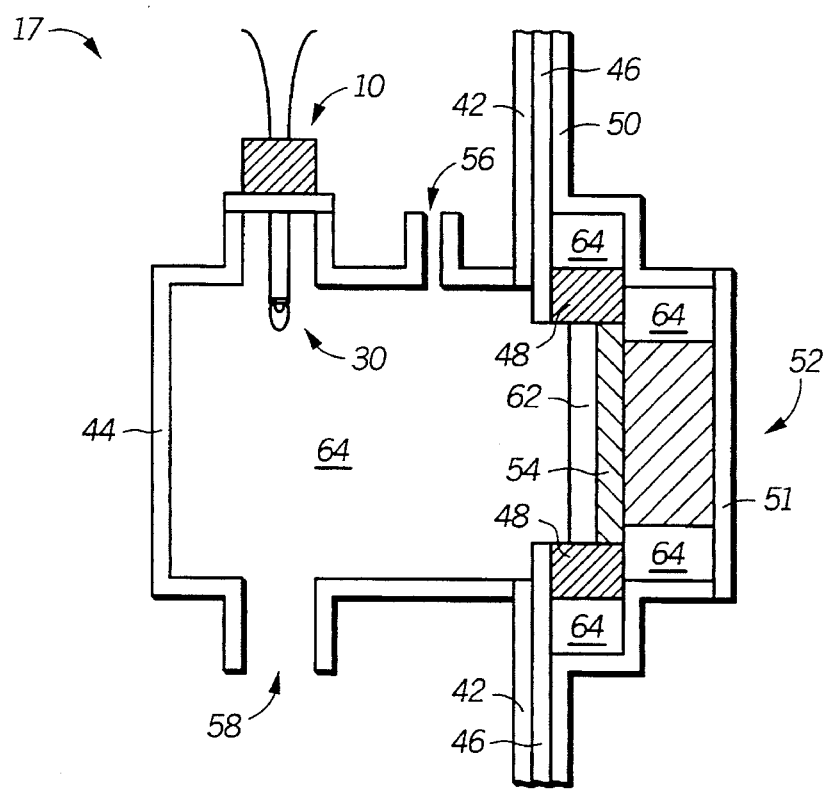

FIGS. 5 through 6 illustrate, in cross-section, one embodiment of the invention wherein plasma ignitor 10 is used with a Varian sputter deposition system, such as a Varian 3180, a Varian 3190, a Varian 3280, Varian 3290, or the like, to process an integrated circuit substrate 62. Shown in FIG. 5 is a portion 17 of a Varian sputter deposition system, wherein plasma ignitor 10 has been mounted to the sputter deposition system and integrated circuit substrate 62 has been placed within the sputter deposition system. The sputter deposition system comprises a pressure plate 42, a vacuum isolation process system (VIPS) can 44, a transfer plate 46, a substrate mount 48, a front plate 50, and an etch head 51, wherein etch head 51 comprises an etch table 52 having an etch electrode 54. VIPS can 44 is mounted to pressure plate 42 and has a gas port 56 for introducing process gases into VIPS can 44 and a vacuum port for evacuating and exhausting process gases from VIPS can 44. Plasma ignitor 10 is mounted to VIPS can 44 such that filament 31 lies within VIPS can 44. Substrate mount 48 is mounted to transfer plate 46 and holds integrated circuit substrate 62 during processing. Etch table 52 is mounted to etch head 51 and etch head 51 is mounted to front plate 50.

In FIG. 6, pressure plate 42, transfer plate 46 and front plate 50 are placed together to form an etch chamber 64. Integrated circuit substrate 62 lies within etch chamber 64 such that the back surface of integrated circuit substrate 62 abuts the front surface of etch electrode 54, as shown in FIG. 6. An etch gas is then introduced into etch chamber 64 through gas port 56 and power is applied to etch electrode 54. In one embodiment, the power applied to etch electrode 54 ranges from about 150 watts to about 250 watts, and argon (flow rate of approximately 150 sccm) serves as the etch gas in etch chamber 64, which has a pressure ranging from about 5 microns to about 10 microns. A plasma is then initiated in etch chamber 64 by applying voltage to plasma ignitor 10. In one embodiment, the voltage applied to plasma ignitor 10, in order to initiate the plasma, is approximately 24 volts (AC). The plasma is then used to etch integrated circuit substrate 62 and form an etched surface. In one embodiment, integrated circuit substrate 62 is etched from about 40 seconds to about 70 seconds. After the plasma in etch chamber 64 has been terminated, pressure plate 42, transfer plate 46, and front plate 50 are then separated so that transfer plate 46 can rotate integrated circuit substrate 62 to a sputter deposition station, that also lies within the sputter deposition system, and a conductive layer of material is then subsequently sputter deposited onto the etched surface of integrated circuit substrate 62.

Figure 7:
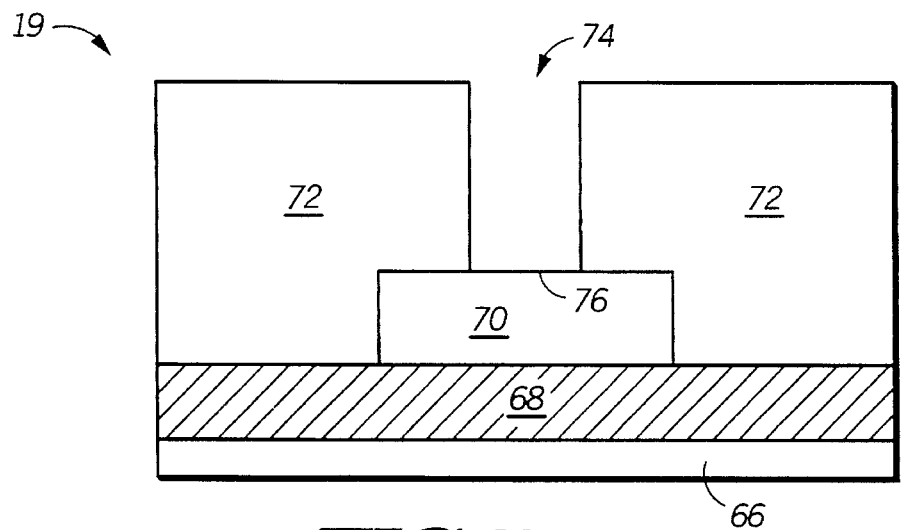
FIGS. 7–9 illustrate, in cross-section, process steps in accordance with one embodiment of the invention.
Figure 8:
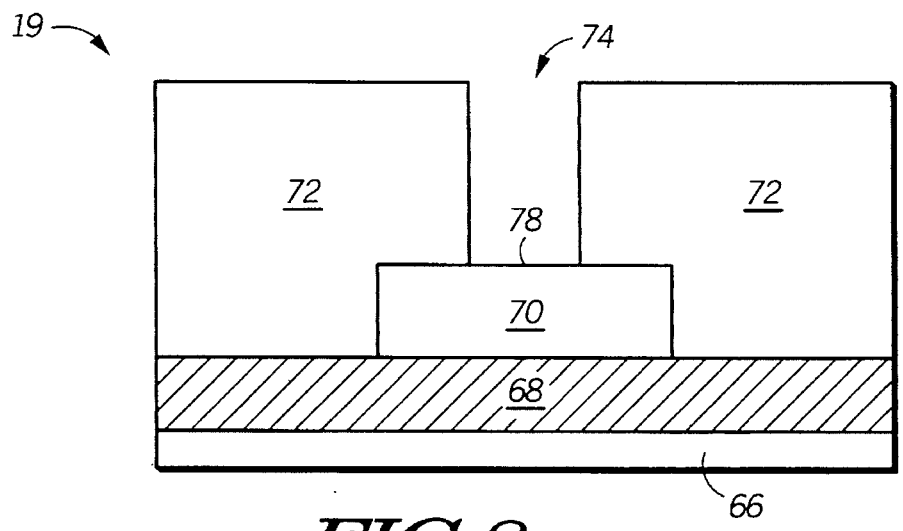
Figure 9:
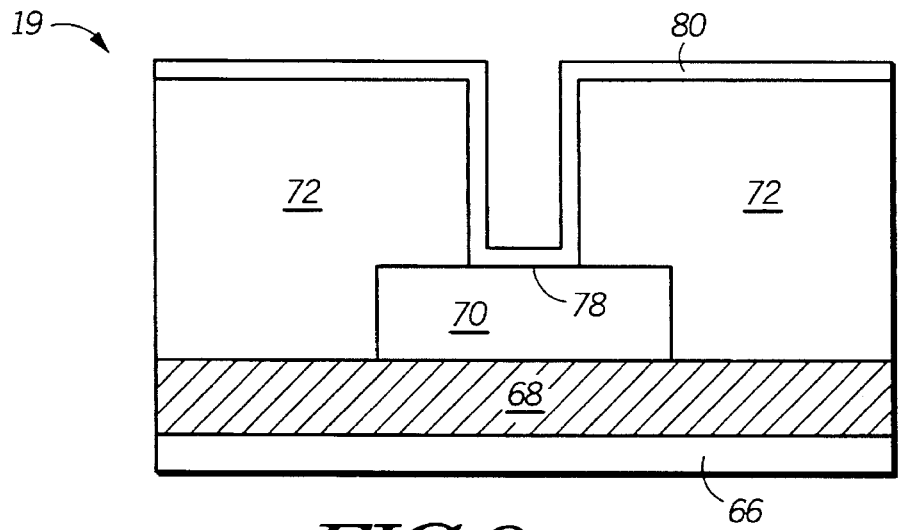

FIGS. 7 through 9 illustrate, in cross-section, one embodiment of the invention at the integrated circuit substrate level. Shown in FIG. 7 is a portion 19 of integrated circuit substrate 62 before it is etched within etch chamber 64. In one embodiment, integrated circuit substrate 62 comprises a semiconductor substrate 66, a first dielectric layer 68, a patterned conductive member 70, and a second dielectric layer 72 having an opening 74 therein, that forms an exposed surface portion 76 of patterned conductive member 70. Semiconductor substrate 66 is preferably a monocrystalline silicon substrate. Alternatively, semiconductor substrate 66 may also be a silicon on insulator substrate, a silicon on sapphire substrate, or the like. In one embodiment, first dielectric layer 68 is a layer of silicon dioxide. Alternatively, first dielectric layer 68 may be another dielectric layer such as silicon nitride or polyimide. First dielectric layer 68 may be formed using conventional techniques, such as spin-on-deposition, low pressure chemical vapor deposition, plasma enhanced chemical vapor deposition, or the like. In addition, first dielectric layer 68 may be formed by thermal oxidation or thermal nitridation of semiconductor substrate 66 itself. Patterned conductive member 70 is formed using conventional photolithographic patterning and etching techniques. Patterned conductive member 70 may be formed using a metal layer comprising aluminum, copper, titanium, tungsten, cobalt, or the like. Alternatively, patterned conductive member 70 may be formed using a doped silicon layer, a metal nitride layer, such as titanium nitride, tantalum nitride, or the like, or a metal silicide layer, such as tungsten silicide, molybdenum silicide, or the like. In one embodiment, second dielectric layer 72 is a layer of silicon dioxide. Alternatively, second dielectric layer 72 may be another dielectric layer such as silicon nitride or polyimide. Second dielectric layer 72 may be formed using conventional techniques such as spin-on-deposition, low pressure chemical vapor deposition, plasma enhanced chemical vapor deposition, or the like. Opening 74 within second dielectric layer 72 is formed using conventional photolithographic and etching techniques to expose a surface portion 76 of conductive member 70.

In FIG. 8, after integrated circuit substrate 62 is within etch chamber 64 a plasma is generated and then used to etch integrated circuit substrate 62 and form an etched surface, as previously discussed. More specifically, the exposed surface portion 76 of conductive member 70 is etched to form an etched surface 78. This etch step removes native oxide or other residues from exposed surface portion 76 that will adversely affect the contact resistance between conductive member 70 and a conductive layer of material that is subsequently deposited in opening 74, as described below.

In FIG. 9 integrated circuit substrate 62 is rotated to a deposition station, after it has been etched, and a conductive layer of material is then deposited onto integrated circuit substrate 62 as previously discussed above. More specifically, a conductive layer of material 80 is sputter deposited onto etched surface 78 as shown in FIG. 9. Conductive layer of material 80 may be a metal layer comprising aluminum, copper, titanium, tungsten, cobalt, tantalum, or the like. Alternatively, conductive layer of material 80 may be a metal nitride layer, such as titanium nitride, tantalum nitride, or the like, or a metal silicide layer, such as tungsten silicide, molybdenum silicide, or the like.

The foregoing description and illustrations contained herein demonstrate many of the advantages associated with the present invention. Interfacial layers that cause high contact resistance can be repeatably removed using Applicants' inventive plasma ignitor. Encasing portions of the plasma ignitor's conductive leads within unitary dielectric housings prevents the conductive leads from shorting to one another. Moreover, locking the plasma ignitor's filament into position prevents the filament from falling off the conductive leads during processing. As a result native oxide layers or residues that cause high contact resistance can be repeatably removed from a surface prior to depositing a conductive layer of material onto the surface. Thus, the present invention allows high speed integrated circuits having multilevel interconnects to be reliably formed.

Thus it is apparent that there has been provided, in accordance with the present invention, a method for forming a conductive layer of material on an integrated circuit substrate that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific integrated circuit structure. More specifically, the present invention is not limited to contact and via structures, but can also be used to etch and then deposit a conductive layer of material on other types of integrated circuit structures. For example, the present invention may be used to etch the source and drain regions of a transistor and then deposit a conductive layer of material on the source and drain regions. Moreover, the inventive process is not limited to a specific etch chamber configuration or to a specific deposition system. More specifically, the present invention is not intended to be limited to Varian sputter deposition systems, but can be performed in other deposition systems. More specifically, conductive layer of material 80 may be formed using sputter deposition or chemical vapor deposition (CVD). Therefore, it is intended that this invention encompass all such variations and modifications as fall within the scope of the appended claims.

What is claimed is:

1. A method for forming a conductive layer of material on an integrated circuit substrate comprising the steps of:

providing an etch chamber having an integrated circuit substrate therein, the etch chamber having a plasma ignitor, the plasma ignitor comprising a first conductive lead, a second conductive lead, a first dielectric housing, and a filament, the filament having a first terminal and a second terminal, wherein the first conductive lead is electrically coupled to the first terminal of the filament and the second conductive lead is electrically coupled to the second terminal of the filament, and wherein the first dielectric housing encases a first portion of the first conductive lead and a first portion of the second conductive lead such that the first portion of the first conductive lead is electrically isolated from the first portion of the second conductive lead and the first portion of the first conductive lead is kept at a fixed distance apart from the first portion of the second conductive lead;

introducing a gas into the etch chamber;

using the plasma ignitor to initiate a plasma in the etch chamber;

using the plasma to etch the integrated circuit substrate and to form an etched surface; and depositing the conductive layer of material on the etched surface.

2. The method of claim 1, wherein the step of providing the etch chamber the plasma ignitor is further characterized as having a second dielectric housing that encases a second portion of the first conductive lead and a second portion of the second conductive lead.

3. The method of claim 1, wherein the step of providing the etch chamber the filament is further characterized as having a dielectric spacer that keeps the first terminal of the filament at a fixed distance apart from the second terminal of the filament.

4. The method of claim 3, wherein the step of providing the etch chamber the plasma ignitor is further characterized as having a sheath surrounding a portion of the first dielectric housing.

5. The method of claim 3, wherein the step of providing the etch chamber the sheath is further characterized as a stainless steel sheath.

6. The method of claim 3, wherein the step of providing the etch chamber the dielectric spacer is further characterized as comprising polyimide.

7. The method of claim 4, wherein the step of providing the etch chamber the plasma ignitor is further characterized as having an end cap, wherein a first portion of the end cap abuts the dielectric spacer and a second portion of the end cap abuts the sheath.

8. The method of claim 7, wherein the step of providing the etch chamber the end cap is further characterized as comprising polyimide.

9. The method of claim 1, wherein the step of depositing a conductive layer of material is further characterized as depositing a metal layer.

10. The method of claim 9, wherein the step of depositing the metal layer is further characterized as depositing a layer of aluminum.

11. The method of claim 9, wherein the step of depositing the metal layer is further characterized as depositing a layer of titanium.

12. The method of claim 9, wherein the step of depositing the metal layer is further characterized as depositing a layer of tantalum.

13. The method of claim 1, wherein the step of depositing a conductive layer of material is further characterized as depositing a metal nitride layer.

14. The method of claim 13, wherein the step of depositing the metal nitride layer is further characterized as depositing a layer of titanium nitride.

15. The method of claim 1, wherein the step of introducing the gas into the etch chamber is further characterized as introducing argon into the etch chamber.

16. A method for forming a conductive layer of material on an integrated circuit substrate comprising the steps of:

providing an etch chamber having an integrated circuit substrate therein, the etch chamber having a plasma ignitor, the plasma ignitor comprising a first conductive lead, a second conductive lead, a first dielectric housing, and a filament, the filament having a first terminal and a second terminal, wherein the first conductive lead is electrically coupled to the first terminal of the filament and the second conductive lead is electrically coupled to the second terminal of the filament, and wherein the first dielectric housing encases a first portion of the first conductive lead and a first portion of the second conductive lead such that the first portion of the first conductive lead is electrically isolated from the first portion of the second conductive lead and the first portion of the first conductive lead is kept at a fixed distance apart from the first portion of the second conductive lead;

introducing argon into the etch chamber;

using the plasma ignitor to initiate a plasma in the etch chamber;

using the plasma to etch the integrated circuit substrate and to form an etched surface; and depositing a metal layer on the etched surface.

17. The method of claim 16, wherein the step of providing the etch chamber the plasma ignitor is further characterized as having a second dielectric housing that encases a second portion of the first conductive lead and a second portion of the second conductive lead.

18. The method of claim 16, wherein the step of providing the etch chamber the filament is further characterized as having a dielectric spacer that keeps the first terminal of the filament at a fixed distance apart from the second terminal of the filament.

19. The method of claim 18, wherein the step of providing the etch chamber the plasma ignitor is further characterized as having a sheath surrounding a portion of the first dielectric housing.

20. The method of claim 18, wherein the step of providing the etch chamber the sheath is further characterized as a stainless steel sheath.

21. The method of claim 18, wherein the step of providing the etch chamber the dielectric spacer is further characterized as comprising polyimide.

22. The method of claim 19, wherein the step of providing the etch chamber the plasma ignitor is further characterized as having an end cap, wherein a first portion of the end cap abuts the dielectric spacer and a second portion of the end cap abuts the sheath.

23. The method of claim 22, wherein the step of providing the etch chamber the end cap is further characterized as comprising polyimide.

24. A method for forming a conductive layer of material on an integrated circuit substrate comprising the steps of:

providing an etch chamber having an integrated circuit substrate therein, the etch chamber having a plasma ignitor, the plasma ignitor comprising a first conductive lead, a second conductive lead, a first dielectric housing comprising polyimide, and a filament, the filament having a first terminal and a second terminal, wherein the first conductive lead is electrically coupled to the first terminal of the filament and the second conductive lead is electrically coupled to the second terminal of the filament, and wherein the first dielectric housing encases a first portion of the first conductive lead and a first portion of the second conductive lead such that the first portion of the first conductive lead is electrically isolated from the first portion of the second conductive lead and the first portion of the first conductive lead is kept at a fixed distance apart from the first portion of the second conductive lead;

introducing argon into the etch chamber;

using the plasma ignitor to initiate a plasma in the etch chamber;

using the plasma to etch the integrated circuit substrate and to form an etched surface; and depositing a metal layer on the etched surface.

25. The method of claim 24, wherein the step of providing the etch chamber the plasma ignitor is further characterized as having a second dielectric housing comprising polyimide that encases a second portion of the first conductive lead and a second portion of the second conductive lead.

26. The method of claim 24, wherein the step of providing the etch chamber the filament is further characterized as having a dielectric spacer comprising polyimide that keeps the first terminal of the filament at a fixed distance apart from the second terminal of the filament.

27. The method of claim 26, wherein the step of providing the etch chamber the plasma ignitor is further characterized as having a sheath surrounding a portion of the first dielectric housing.

28. The method of claim 26, wherein the step of providing the etch chamber the sheath is further characterized as a stainless steel sheath.

29. The method of claim 27, wherein the step of providing the etch chamber the plasma ignitor is further characterized as having an end cap, wherein a first portion of the end cap abuts the dielectric spacer and a second portion of the end cap abuts the sheath.

30. The method of claim 29, wherein the step of providing the etch chamber the end cap is further characterized as comprising polyimide.

* * * * *